(12) United States Patent
Li et al.

(10) Patent No.: US 9,768,801 B1
(45) Date of Patent: Sep. 19, 2017

(54) METHOD AND DEVICE FOR COMPRESSING FLOW DATA

(71) Applicant: HUAWEI TECHNOLOGIES CO., LTD., Shenzhen, Guangdong (CN)

(72) Inventors: Zhenguo Li, Shenzhen (CN); Ge Luo, Hong Kong (HK); Ke Yi, Hong Kong (HK); Wei Fan, Shenzhen (CN); Cheng He, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/597,963

(22) Filed: May 17, 2017

Related U.S. Application Data

(63) Continuation of application No. PCT/CN2015/079875, filed on May 27, 2015.

(30) Foreign Application Priority Data

Nov. 17, 2014 (CN) .......................... 2014 1 0653071

(51) Int. Cl.
*H03M 7/30* (2006.01)
(52) U.S. Cl.
CPC ..................................... *H03M 7/30* (2013.01)
(58) Field of Classification Search
None
See application file for complete search history.

(56) References Cited

U.S. PATENT DOCUMENTS 5,857,036 A * 1/1999 Barnsley ................. G06T 9/001
382/244

6,215,907 B1   4/2001 Kumar et al.
2005/0192994 A1   9/2005 Caldwell et al.

FOREIGN PATENT DOCUMENTS

CN   101500166 A   8/2009
CN   101807925 A   8/2010
(Continued)

OTHER PUBLICATIONS

Joseph O'Rourke, "Rourke. An on-line algorithm for fitting straight lines between data ranges", Communications of the ACM, vol. 24, No. 9, Sep. 1981, total 5 pages.
(Continued)

*Primary Examiner* — Howard Williams
(74) *Attorney, Agent, or Firm* — Huawei Technologies Co., Ltd.

(57) ABSTRACT

A method for compressing flow data, including: constructing multiple line segments according to flow data and a predefined maximum error that are acquired; obtaining a target piecewise linear function according to the multiple line segments, where the target piecewise linear function includes multiple linear functions, and an intersection set of value ranges of independent variables of every two linear functions among the multiple linear functions includes a maximum of one value; and outputting a reference data point according to the target piecewise linear function, where the reference data point includes a point of continuity and a point of discontinuity of the target piecewise linear function. In this way, a maximum error, a target piecewise linear function is further determined according to the multiple line segments, and a point of continuity and a point of discontinuity of the target piecewise linear function are used to represent compressed flow data.

18 Claims, 6 Drawing Sheets

(56) References Cited

FOREIGN PATENT DOCUMENTS

CN          102098058 A      6/2011
WO     WO 2016078379 A1 *   5/2016    .............. H03M 7/30

OTHER PUBLICATIONS

S. L. Hakimi and E. F. Schmeichel, "Fitting polygonal functions to a set of points in the plane". CVGIP: Graph. Models Image Process., vol. 53, No. 2, Mar., 1991. pp. 132-136, total 5 pages.
H. Elmeleegy et al., "Online piece-wise linear approximation of numerical streams with precision guarantees", In Proc. International Conference on Very Large Data Bases, Aug. 24-28, 2009. total 12 pages.

* cited by examiner

METHOD AND DEVICE FOR COMPRESSING FLOW DATA

CROSS-REFERENCE TO RELATED APPLICATIONS

This application is a continuation of International Application No. PCT/CN2015/079875, filed on May 27, 2015, which claims priority to Chinese Patent Application No. 201410653071.1, filed on Nov. 17, 2014. The disclosures of the aforementioned applications are hereby incorporated by reference in their entireties.

TECHNICAL FIELD

Embodiments of the present application relate to the field of information processing, and in particular, to a method and device for compressing flow data.

BACKGROUND

Flow data refers to a sequence of data that arrives sequentially, rapidly, and continuously in a large amount. Generally, flow data can be considered as a set of dynamic data that increases infinitely with time. Flow data appears in a wide range of application fields such as network monitoring, sensor networks, aerospace, meteorological measurement and control, and financial services. Through study on flow data, satellite cloud imagery monitoring, stock market trend analysis, network attack judgment, and the like can be performed.

In a process of observing or storing flow data in real time, the flow data needs to be compressed first due to the limitation of storage space.

For a same group of flow data, a higher compression rate indicates a lower requirement on storage space. However, in existing methods for compressing flow data, compression rates are not high enough, and therefore, a requirement on storage space is not the lowest.

SUMMARY

Embodiments of the present application provide a method for compressing flow data, which has the lowest requirement on storage space.

According to a first aspect, a method for compressing flow data is provided, including:

acquiring flow data, where the flow data includes multiple data points, and each data point of the multiple data points includes collection time of each data point and a data value collected at the collection time;

acquiring a predefined maximum error, and constructing multiple line segments according to the multiple data points and the maximum error, where the multiple line segments do not intersect with each other; each line segment of the multiple line segments represents a function with time as an independent variable; and when a value of the independent variable is the collection time, an absolute value of a difference between a function value of the function and the data value collected at the collection time is less than or equal to the maximum error;

obtaining a target piecewise linear function according to the multiple line segments, where the target piecewise linear function includes multiple linear functions, and an intersection set of value ranges of independent variables of every two linear functions among the multiple linear functions includes a maximum of one value; and outputting a reference data point according to the target piecewise linear function, where the reference data point is used to represent compressed flow data, and the reference data point includes a point of continuity and a point of discontinuity of the target piecewise linear function.

With reference to the first aspect, in a first possible implementation manner of the first aspect, the constructing multiple line segments according to the multiple data points and the maximum error includes:

creating an extended polygon according to the multiple data points and the maximum error, where the extended polygon is used to represent a region in which the multiple line segments are located; and calculating a linked list based on the extended polygon, where the linked list includes an information field $C[k]$ and a pointer field $pred[k]$ the information field $C[k]$ is used to represent the multiple line segments, and the pointer field $pred[k]$ used to indicate that the information field $C[k]$ points to an information field $C[pred[k]]$, where $k$ is a non-negative integer that is not equal to 1, and $C[k]$ corresponding to each value of $k$ is used to represent one line segment of the multiple line segments.

With reference to the first possible implementation manner of the first aspect, in a second possible implementation manner of the first aspect, $C[k]$ is obtained by using the following expression:

$$C[k] = \begin{cases} cw(w_0), & \text{condition 1} \\ cw(nw(C[k-3])), & \text{condition 2} \\ cw(C[k-2]), & \text{others} \end{cases}$$

where
condition 1 is: $k=0$;
condition 2 is: $k=3$ or $k\geq 5$ and $cw(C[k-2])$ is located on the left side of $cw(nw(C[k-3]))$;
for $k=0$, $pred[0]$ is null; and
for $k\neq 0$, if $C[k]=cw(nw(C[k-3]))$, $pred[k]=k-3$;
if $C[k]=cw(C[k-2])$, $pred[k]=k-2$; where
$w_0$ is an initial window, $cw(\square)$ represents a closing window, and $nw(\square)$ represents a next window.

With reference to the first possible implementation manner of the first aspect or the second possible implementation manner of the first aspect, in a third possible implementation manner of the first aspect, the obtaining a target piecewise linear function according to the multiple line segments includes:

obtaining the target piecewise linear function according to a direction relation between the multiple line segments.

With reference to any possible implementation manner among the first possible implementation manner of the first aspect to the third possible implementation manner of the first aspect, in a fourth possible implementation manner of the first aspect, the obtaining a target piecewise linear function according to the multiple line segments includes:

pruning the linked list, so that for different values of $k$, values of $pred[k]$ are unequal; and obtaining the target piecewise linear function according to the pruned linked list.

With reference to any one of the possible implementation manners of the first aspect, in a fifth possible implementation manner of the first aspect, the linked list further includes a count field $ref[k]$, used to represent a quantity of information fields that point to the information field $C[k]$;

if $pred[k+2]=k$ and $pred[k+3]=k$, $ref[k]=2$;
if $pred[k+2]=k$ and $pred[k+3]\neq k$, $ref[k]=1$;

if pred[k+2]≠k and pred[k+3]=k, ref[k]=1; and
if pred[k+2]≠k and pred[k+3]≠k, ref[k]=0.

With reference to the fifth possible implementation manner of the first aspect, in a sixth possible implementation manner of the first aspect, the pruning the linked list includes:

C[j], pred[j], ref[j] deleting that correspond to ref[j]=0 from the linked list and updating ref[pred[j]].

With reference to any possible implementation manner among the third possible implementation manner of the first aspect to the sixth possible implementation manner of the first aspect, in a seventh possible implementation manner of the first aspect, the obtaining the target piecewise linear function according to the pruned linked list includes:

using a generation line segment corresponding to C[k] in the pruned linked list as the multiple linear functions, and forming the target piecewise linear function by using the multiple linear functions.

With reference to the first aspect or any one of the possible implementation manners of the first aspect, in an eighth possible implementation manner of the first aspect, the multiple linear functions include a first linear function and a second linear function that are adjacent to each other, where the "adjacent" indicates that an intersection set of a value range of an independent variable of the first linear function and a value range of an independent variable of the second linear function is not null, and the intersection set is a collection time parameter;

when a value of the independent variable is the collection time parameter, a function value of the first linear function is a first function value;

when a value of the independent variable is the collection time parameter, a function value of the second linear function is a second function value;

when the first function value is equal to the second function value, the reference data point includes the collection time parameter and the first function value; and when the first function value is not equal to the second function value, the reference data point includes the collection time parameter, the first function value, and the second function value.

According to a second aspect, a device for compressing flow data is provided, including:

an acquiring unit, configured to acquire flow data and acquire a predefined maximum error, where the flow data includes multiple data points, and each data point of the multiple data points includes collection time of each data point and a data value collected at the collection time;

a constructing unit, configured to construct multiple line segments according to the multiple data points and the maximum error that are acquired by the acquiring unit, where the multiple line segments do not intersect with each other; each line segment of the multiple line segments represents a function with time as an independent variable; and when a value of the independent variable is the collection time, an absolute value of a difference between a function value of the function and the data value collected at the collection time is less than or equal to the maximum error;

a obtaining unit, configured to determine a target piecewise linear function according to the multiple line segments constructed by the constructing unit, where the target piecewise linear function includes multiple linear functions, and an intersection set of value ranges of independent variables of every two linear functions among the multiple linear functions includes a maximum of one value; and an output unit, configured to output a reference data point according to the target piecewise linear function determined by the obtaining unit, where the reference data point is used to represent compressed flow data, and the reference data point includes a point of continuity and a point of discontinuity of the target piecewise linear function.

With reference to the second aspect, in a first possible implementation manner of the second aspect, the constructing unit is specifically configured to:

create an extended polygon according to the multiple data points and the maximum error, where the extended polygon is used to represent a region in which the multiple line segments are located; and calculate a linked list based on the extended polygon, where the linked list includes an information field C[k] and a pointer field pred[k] the information field C[k] is used to represent the multiple line segments, and the pointer field pred[k] is used to indicate that the information field C[k] points to an information field C[pred[k]], where k is a non-negative integer that is not equal to 1, and C[k] corresponding to each value of k is used to represent one line segment of the multiple line segments.

With reference to the first possible implementation manner of the second aspect, in a second possible implementation manner of the second aspect, C[k] is obtained by using the following expression:

$$C[k] = \begin{cases} cw(w_0), & \text{condition 1} \\ cw(nw(C[k-3])), & \text{condition 2} \\ cw(C[k-2]), & \text{others} \end{cases}$$

where
condition 1 is: k=0;
condition 2 is: k=3 or k≥5 and cw(C[k−2]) is located on the left side of cw(nw(C[k−3]));
for k=0, pred[0], is null; and
for k≠0, if C[k]=cw(nw(C[k−3])), pred[k]=k−3;
if C[k]=cw(C[k−2]), pred[k]=k−2; where
$w_0$ is an initial window, cw(□) represents a closing window, and nw(□) represents a next window.

With reference to the first possible implementation manner of the second aspect or the second possible implementation manner of the second aspect, in a third possible implementation manner of the second aspect, the obtaining unit is specifically configured to determine the target piecewise linear function according to a direction relation between the multiple line segments.

With reference to any one of the possible implementation manners of the second aspect, in a fourth possible implementation manner of the second aspect, the obtaining unit is specifically configured to:

prune the linked list, so that for different values of k, values of pred[k] are unequal; and determine the target piecewise linear function according to the pruned linked list.

With reference to any one of the possible implementation manners of the second aspect, in a fifth possible implementation manner of the second aspect, the linked list further includes a count field ref[k], used to represent a quantity of information fields that point to the information field C[k];

if pred[k+2]=k and pred[k+3]=k, ref[k]=2;
if pred[k+2]=k and pred[k+3]≠k, ref[k]=1;
if pred[k+2]≠k and pred[k+3]=k, ref[k]=1; and
if pred[k+2]≠k and pred[k+3]≠k, ref[k]=0.

With reference to the fifth possible implementation manner of the second aspect, in a sixth possible implementation manner of the second aspect, the obtaining unit is specifically configured to:

delete C[j], pred[j], ref[j] that correspond to ref[j] from the linked list and update ref[pred[j]].

With reference to any possible implementation manner among the fourth possible implementation manner of the second aspect to the sixth possible implementation manner of the second aspect, in a seventh possible implementation manner of the second aspect, the obtaining unit is specifically configured to: use a generation line segment corresponding to C[k] in the pruned linked list as the multiple linear functions, and form the target piecewise linear function by using the multiple linear functions.

With reference to the second aspect or any one of the possible implementation manners of the second aspect, in an eighth possible implementation manner of the second aspect, the multiple linear functions include a first linear function and a second linear function that are adjacent to each other, where the "adjacent" indicates that an intersection set of a value range of an independent variable of the first linear function and a value range of an independent variable of the second linear function is not null, and the intersection set is a collection time parameter;

when a value of the independent variable is the collection time parameter, a function value of the first linear function is a first function value;

when a value of the independent variable is the collection time parameter, a function value of the second linear function is a second function value;

when the first function value is equal to the second function value, the reference data point includes the collection time parameter and the first function value; and when the first function value is not equal to the second function value, the reference data point includes the collection time parameter, the first function value, and the second function value.

In the embodiments of the present application, multiple line segments are constructed according to multiple data points and a maximum error, a target piecewise linear function is further determined according to the multiple line segments, and a point of continuity and a point of discontinuity of the target piecewise linear function are used to represent compressed flow data. The method of the embodiments of the present application can ensure that the target piecewise linear function has a minimum quantity of parameters, which therefore has the lowest requirement on storage space.

BRIEF DESCRIPTION OF DRAWINGS

To describe the technical solutions in the embodiments of the present application more clearly, the following briefly introduces the accompanying drawings required for describing the embodiments. Apparently, the accompanying drawings in the following description show merely some embodiments of the present application, and a person of ordinary skill in the art may still derive other drawings from these accompanying drawings without creative efforts.

DESCRIPTION OF EMBODIMENTS

The following clearly describes the technical solutions in the embodiments of the present application with reference to the accompanying drawings in the embodiments of the present application. Apparently, the described embodiments are some but not all of the embodiments of the present application. All other embodiments obtained by a person of ordinary skill in the art based on the embodiments of the present application without creative efforts shall fall within the protection scope of the present application.

Flow data can be expressed as a time sequence $S = \{p_1, p_2, \ldots, p_i, \ldots\}$, where a point $p_i = (t_i, y_i)$ in the time sequence is a data point in the flow data and indicates that a data value collected at the time $t_i$ is $y_i$.

It may be understood that the flow data includes multiple data points, and each data point includes two numerals, which represent a collection time and a data value collected at the collection time, respectively. The collection of the flow date may be performed periodically or aperiodically, by means of collection, measurement, or the like.

The physical meaning of the data value is related to an original source of the flow data. Correspondingly, the data value is also related to a specific scenario of the flow data, which is not limited in the embodiments of the present application.

For example, if the flow data is generated by monitoring network traffic, the data value represents network traffic. It may be understood that the data value is a non-negative value in this case.

For example, if the flow data is generated by tracking an MBB digital trail, the data value represents coordinates of the trail.

For example, if the flow data is generated by measuring a temperature of ocean water, the data value represents a temperature of ocean water. It may be understood that the data value is greater than or equal to absolute zero.

For example, if the flow data is generated by observing a stock price in the stock market, the data value represents a stock price. It may be understood that the data value is a positive number in this case.

It is assumed that in a process of collecting or storing the flow data, a maximum allowed error is e, that is, an approximate error is e.

It should be noted that the maximum error is related to the physical meaning of the data value. For example, if the data value represents a temperature of ocean water, the maximum allowed error may be e=0.1 Celsius degree (° C.). For example, if the data value represents a stock price, the maximum allowed error may be e=0.01 yuan (Chinese Yuan, CNY).

A method for depicting flow data is creating a piecewise linear function $f$ and approximating a time sequence S by using the piecewise linear function $f$, so as to implement piecewise linear approximation (Piecewise Linear Approximation, PLA) of the flow data. Moreover, for any $t_i$, $|f(t_i)-y_i|\le e$ holds.

Figure 1A:
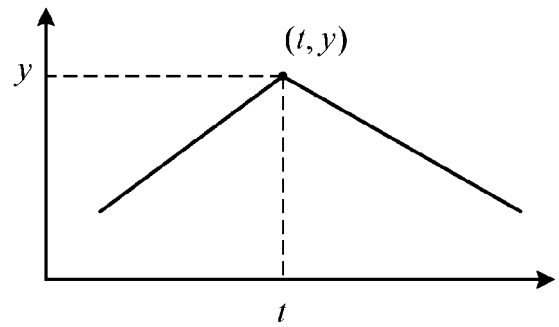
FIG. 1(a) and FIG.
Figure 1B:
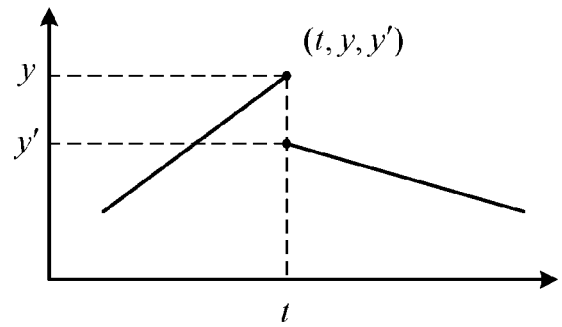
FIG. 1(b) are a schematic diagram of two piecewise linear functions.

Generally, a piecewise linear function may be continuous or discontinuous, as shown in FIG. 1(a) and FIG. FIG. 1(b). It should be noted that the "continuous" or "discontinuous" herein indicates continuity or discontinuity between linear functions. Specifically, FIG. 1(a) shows a continuous piecewise linear function, which needs to be indicated by two parameters. As shown in FIG. 1(a), the two parameters are (t, y), which can also be understood as coordinates of an inflection point of the piecewise linear function mathematically. FIG. 1(b) shows a discontinuous piecewise linear function, which needs to be indicated by three parameters. As shown in FIG. 1(b), the three parameters are (t, y, y').

It should be noted that in the embodiments of the present application, one parameter is one numeral, which may be a value of an independent variable of the piecewise linear function or may be a value of a dependent variable of the piecewise linear function. A quantity of parameters is a quantity of parameters of the piecewise linear function apart from an initial point and a final point.

In this case, in the process of collecting or storing the flow data, the flow data may be depicted by using the parameters of the piecewise linear function, or the parameters of the piecewise linear function may be stored.

For any data point $p_i=(t_i, y_i)$ in the flow data, it may be determined according to the maximum allowed error that an upper limit is $p_i^u=(t_i,y_i+e)$ and a lower limit is $p_i^l=(t_i,y_i-e)$. That is, for each data point, a corresponding upper limit point and a corresponding lower limit point can be obtained according to the maximum error. Further, for at least three contiguous data points, an extended polygon P may be created.

Specifically, assuming that there are n data points, the extended polygon P may include an upper chain (Upper chain) U, a lower chain (Lower chain) L, an initial window (initial window), and a final window (final window). The upper chain is created according to an upper limit point and the lower chain is created according to a lower limit point.

Figure 2:
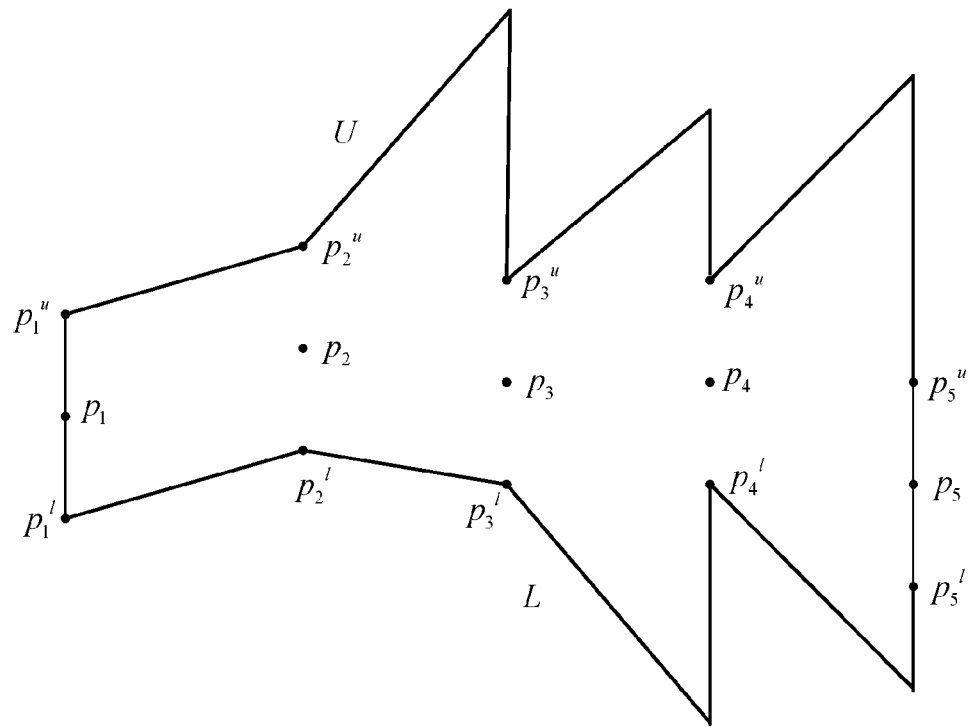
FIG. 2 shows an extended polygon P formed by five data points according to an embodiment of the present application.

FIG. 2 shows an extended polygon P formed by n data points, where n=5.

If $p_i^u p_{i+1}^u$ is lower than $p_{i-1}^u p_i^u$, an upper chain between $p_i^u$ and $p_{i+1}^u$ is formed by an extension line of $p_{i-1}^u p_i^u$ and a vertical line starting from the data point $p_{i+1}^u$, for example, an upper chain between $p_2^u$ and $p_3^u$ in FIG. 2.

Similarly, if $p_i^l p_{i+1}^l$ is higher than $p_{i-1}^u p_i^l$ a lower chain between $p_i^l$ and $p_{i+1}^l$ is formed by an extension line of $p_{i-1}^u p_i^l$ and a vertical line starting from the data point $p_{i+1}^l$, for example, a lower chain between $p_3^l$ and $p_4^l$ in FIG. 2.

Specifically, in FIG. 2, the initial window is $p_1^u p_1^l$ and the final window is $p_5^u p_5^l$. The upper chain is a polyline from $p_1^u$ to $p_5^u$ and is marked as U in FIG. 2. The lower chain is a polyline from $p_1^l$ to $p_5^l$ and is marked as L in FIG. 2.

In the embodiments of the present application, a window is defined as a connection line segment from a point on an upper chain to a point on a lower chain in an extended polygon.

It may be understood that the extended polygon P satisfies:

$$P=\{(t,y)|t_i\le t\le t_{i+1}, l_i(t)\le y\le u_i(t), i=1,2,\ldots\},$$

which indicates that a set of all points (t, y) that satisfy the condition $t_i\le t\le t_{i+1}$, $l_i(t)\le y\le u_i(t)$ form the extended polygon P, where $$l_i(t)=\begin{cases} \overline{p_i^l p_{i+1}^l}(t) & i=1 \\ \min\{\overline{p_{i-1}^u p_i^l}(x), \overline{p_i^l p_{i+1}^l}(x)\} & 2\le i\le n-1 \end{cases},$$

and $$u_i(t)=\begin{cases} \overline{p_i^u p_{i+1}^u}(t) & i=1 \\ \min\{\overline{p_{i-1}^l p_i^u}(x), \overline{p_i^u p_{i+1}^u}(x)\} & 2\le i\le n-1 \end{cases};$$

that is, a polyline formed by $l_i(t)$ is the lower chain L, and a polyline formed by $u_i(t)$ is the upper chain U.

In the embodiments of the present application, pq represents a line segment from a data point p to a data point q. $\overline{pq}$ represents a straight line on which the data point p and the data point q are located.

For a determined extended polygon P, a visible region (visible region) of any window can be defined. Moreover, the visible region is located on the right side of the window. In the embodiments of the present application, the right side refers to a direction along which time increases.

Assuming that a window is pq, a visible region is expressed as vr(pq), and any point in the visible region is visible relative to the window pq, that is, a connection line segment from any point in the visible region to a point on the window pq is located within the extended polygon P.

It may also be understood that if a point A is located on the right side of the window pq and a connection line segment from the point A to a point on the window pq is located within the extended polygon P, the point A is located within the visible region vr(pq) of the window pq. Alternatively, a region composed of a set of all points A that satisfy the condition is the visible region vr(pq) of the window pq.

Further, a window on the rightmost side of the visible region vr(pq) may be referred to as a closing window (closing window) of the visible region of the window pq, and may be expressed as cw(vr(pq)); or the window may be briefly referred to a closing window of the window pq, and may be expressed as cw(pq).

The closing window cw(pq) is extended to the window pq. A line segment located within the visible region vr(pq) is referred to as a generation line segment of the visible region, and may be expressed as gen(vr(pq)); or the line may be referred to as a generation line) segment of the window pq, and may be expressed as gen(pq). The generation line segment gen(pq) has two end points, where one end point is located on the window pq, and the other end point is the right end point of the closing window cw(pq).

Moreover, a data window in which the first data point located on the right side of the closing window is located may be referred to as a next window (next window) of the window pq, or a next data window, and may be expressed as nw(pq).

It should be noted that, in the embodiments of the present application, a data window of a data point is a window formed by an upper limit point and a lower limit point of the data point. For example, a data point is $p_i=(t_i, y_i)$, a data window in which the data point is located is $p_i^u p_i^l$, where $p_i^u=(t_i,y_i+e)$ is an upper limit point, and $p_i^l=(t_i,y_i-e)$ is a lower limit point.

It may be understood that the next window does not intersect with the closing window.

Figure 3:
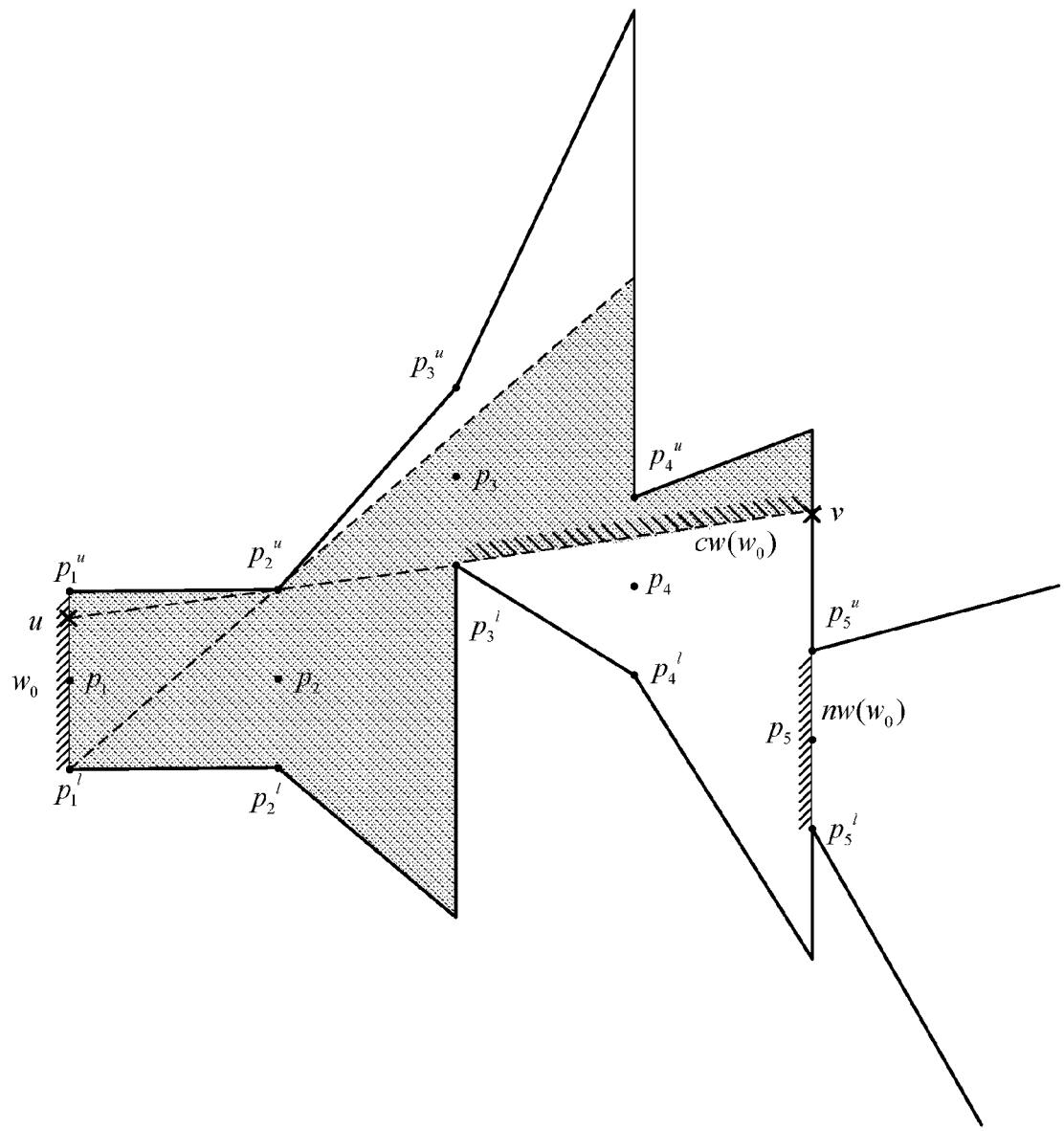
FIG. 3 is a schematic diagram of a visible region and a window according to an embodiment of the present application.

For example, as shown in FIG. 3, a window $p_1^u p_1^l$ is expressed as $w_0$, and a shadow region is a visible region of the window $w_0$ and is expressed as $vr(w_0)$. A window at the rightmost side of the shadow region is a closing window of the visible region of the window $w_0$, that is, a window $p_3^l v$, and is expressed as $cw(w_0)$. A line segment extending from the closing window to the window $p_1^u p_1^l$ is a generation line segment of the visible region or a generation line segment of the window $w_0$, that is, a line segment uv, and is expressed as $gen(vr(w_0))$ or $gen(w_0)$. A data window $p_5^u p_5^l$ in which the first data point on the right side of the closing window $p_3^l v$ is located is a next window of the window $w_0$, and is expressed as $nw(w_0)$.

The generation line segment $gen(w_0)$ has two end points u and v, where one end point u is located on the window $w_0$, and the other end point v is the right end point of the closing window $cw(w_0)$.

$nw(w_0)$ does not intersect with $cw(w_0)$.

It should be noted that, as shown in FIG. 3, the visible region $vr(w_0)$ can be determined only after a data point $p_5$ is acquired. It may also be considered that the data point $p_5$ closes the visible region. Correspondingly, it may be understood that the visible region is open (open) before the data point $p_5$ is acquired.

In other words, before a closing window of a visible region can be determined, the visible region is open. A visible region is closed only after a closing window of the visible region is determined.

In this way, it may be understood that fitting may be performed on the first four data points $p_1$, $p_2$, $p_3$, $p_4$ in FIG. 3 by using the generation line segment $gen(w_0)$. Moreover, only four parameters of the two points u and v are needed for representing the four data points $p_1$, $p_2$, $p_3$, $p_4$.

Figure 4:
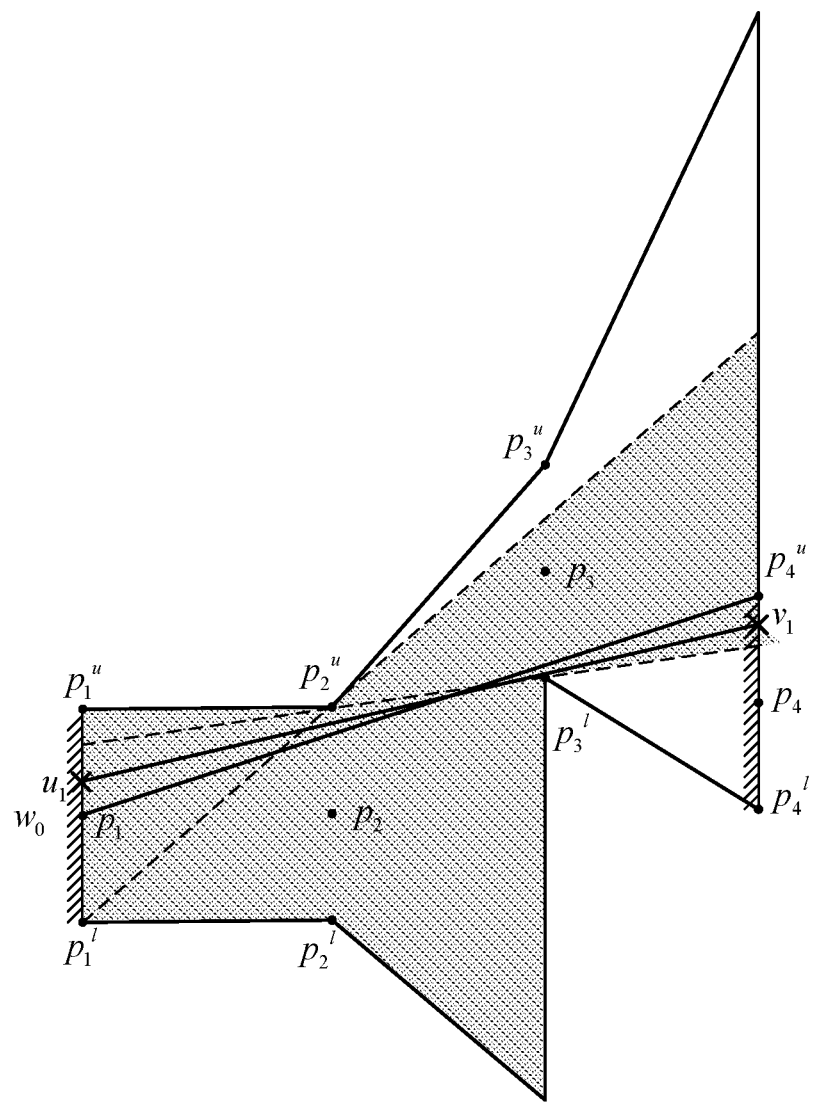
FIG. 4 is a schematic diagram of a generation line segment according to an embodiment of the present application.

Moreover, it may be understood that if the data point $p_4$ is the last data point of the flow data, that is, assuming that a window $p_4^u p_4^l$ is a final window, because the visible region is not closed yet, flow data in the visible region may be indicated by using any segment located within the visible region, for example, a line segment $u_1 v_1$ or a line segment $p_1 p_4^u$ in FIG. 4.

In this way, in the embodiments of the present application, an extended polygon can be created online according to data points and a maximum error. That is, an extended polygon can be gradually created in a process of acquiring data points. Moreover, it may be understood that for any window in the extended polygon, a visible region of the any window can be determined. If a final window is not located within the visible region, a closing window and a next window of the any window may be further determined.

Moreover, it can be mathematically proved that for a determined window, a closing window of a visible region of the determined window is unique, and a next window of the determined window is also unique.

In the embodiments of the present application, a reference data point for indicating flow data is determined in a process of compressing the flow data. Specifically, the first point and the last point are not considered in the embodiments of the present application.

Figure 5:
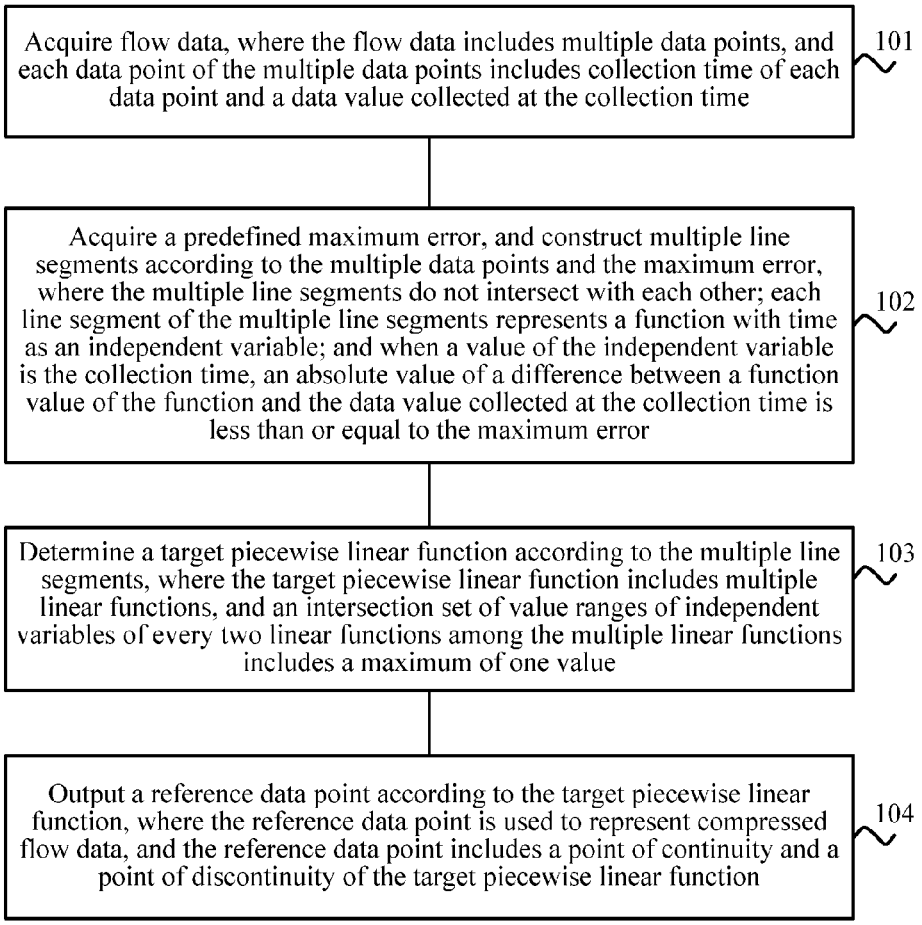
FIG. 5 is a flowchart of a method for compressing flow data according to an embodiment of the present application.

FIG. 5 is a method for compressing flow data according to an embodiment of the present application. The method shown in FIG. 5 includes:

101: Acquire flow data, where the flow data includes multiple data points, and each data point of the multiple data points includes collection time of each data point and a data value collected at the collection time.

102: Acquire a predefined maximum error, and construct multiple line segments according to the multiple data points and the maximum error, where the multiple line segments do not intersect with each other; each line segment of the multiple line segments represents a function with time as an independent variable; and when a value of the independent variable is the collection time, an absolute value of a difference between a function value of the function and the data value collected at the collection time is less than or equal to the maximum error.

103: Determine a target piecewise linear function according to the multiple line segments, where the target piecewise linear function includes multiple linear functions, and an intersection set of value ranges of independent variables of every two linear functions among the multiple linear functions includes a maximum of one value.

104: Output a reference data point according to the target piecewise linear function, where the reference data point is used to represent compressed flow data, and the reference data point includes a point of continuity and a point of discontinuity of the target piecewise linear function.

In this way, in this embodiment of the present application, multiple line segments are constructed according to multiple data points and a maximum error, a target piecewise linear function is further determined according to the multiple line segments, and a point of continuity and a point of discontinuity of the target piecewise linear function are used to represent compressed flow data. The method of this embodiment of the present application can ensure that the target piecewise linear function has a minimum quantity of parameters, which therefore has the lowest requirement on storage space.

It may be understood that the flow data may be acquired at a time in 101, for example, the flow data is static data; or the flow data may be acquired online in 101, for example, data points may be acquired one by one based on time, which is not limited in the present application.

It may be understood that the requirement of the maximum error should be satisfied in the process of compressing the flow data. That is, a difference between the compressed flow data and the flow data acquired in 101 should be less than or equal to the maximum error.

Optionally, in this embodiment of the present application, in 102, the extended polygon may be created according to the multiple data points and the maximum error. The extended polygon is used to represent a region in which the multiple line segments are located. The linked list is calculated based on the extended polygon. The linked list includes an information field C[k] and a pointer field pred[k], where the information field C[k] is used to represent the multiple line segments, and the pointer field pred[k] is used to indicate that the information field C[k] points to an information field C[pred[k]], where k is a non-negative integer that is not equal to 1, and C[k] corresponding to each value of k is used to represent one line segment of the multiple line segments.

The manner for creating an extended polygon is described above. For details, reference may be made to the manner for creating an extended polygon in FIG. 2, which is not described herein again to avoid repetition. Moreover, it may be understood that any line segment located inside the extended polygon can satisfy the requirement of the maximum error.

Specifically, the information field and the pointer field in the linked list are determined according to the following expression:

$$C[k] = \begin{cases} cw(w_0), & \text{condition 1} \\ cw(nw(C[k-3])), & \text{condition 2} \\ cw(C[k-2]), & \text{others} \end{cases}$$

where
condition 1 is: k=0;
condition 2 is: k=3 or k≥5 and cw(C[k−2]) is located on the left side of cw(nw(C[k−3]));
for k=0, pred[0] is null; and
for k≠0, if C[k]=cw(nw(C[k−3])), pred[k]=k−3;
if C[k]=cw (C[k−2]), pred[k]=k−2; where $w_0$ is an initial window, cw(□) represents a closing window, and nw(□) represents a next window.

In this embodiment of the present application, "≤" may be used to represent a position relation between windows. Specifically, $w_1 \leq w_2$ indicates that a window $w_1$ is located on the left side of a window $w_2$, and the window $w_1$ does not intersect with the window $w_2$. Moreover, it can be mathematically proved that if $w_1 \leq w_2$, $cw(w_1) \leq cw(w_2)$ is also satisfied definitely.

It may be understood that if time corresponding to each point on the window $w_1$ is less than or equal to time corresponding to each point on the window $w_2$, $w_1 \leq w_2$.

Correspondingly, condition 2 may also be expressed as:

k=3 or k≥5 and cw(C[k−2])≤cw(nw(C[k−3])).

In this way, an extended polygon can be created online and a linked list can be determined online in a process of acquiring data points of flow data online.

Figure 6:
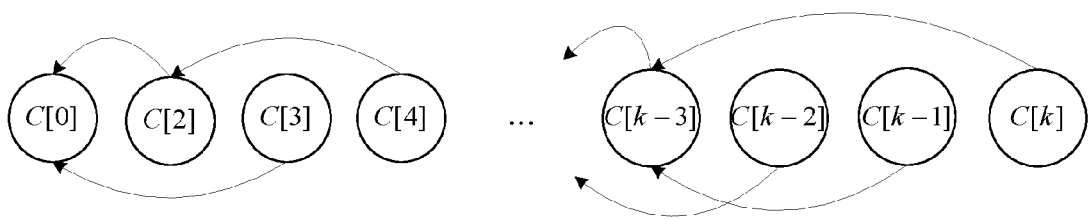
FIG. 6 is a schematic diagram of a linked list according to an embodiment of the present application.

Optionally, the linked list may be shown in FIG. 6, where arrows represent pointer fields.

Optionally, in this embodiment of the present application, in 103, the target piecewise linear function may be determined according to a direction relation between the multiple line segments.

Optionally, in an embodiment, 103 may include: pruning (prune) the linked list, so that for different values of k, values of pred[k] are unequal; and obtaining the target piecewise linear function according to the pruned linked list.

In this way, the linked list can be changed into a one-way linked list through pruning. That is, the pruned linked list is a one-way linked list.

Rules of pruning are limited herein, that is, for different values of k, values of pred[k] are unequal. In this way, it can be mathematically proved that a minimum quantity of parameters are needed for performing piecewise linear approximation on the flow data by using the target piecewise linear function determined after pruning. The target piecewise linear function is formed by multiple linear functions. That is, after rules of pruning are set, it can ensured that the target piecewise linear function has a minimum quantity of parameters. Correspondingly, it may be understood that k may represent a quantity of parameters needed apart from an initial point and a final point. C[k] may represent a furthest window that can be reached when k parameters are used.

It may be understood that, in this embodiment of the present application, pruning processing may be performed after all of the data points of the flow data are acquired, or pruning processing may be performed in the process of acquiring the data points online. For example, all linked lists corresponding to values less than k−4 may be pruned online.

Figure 7:
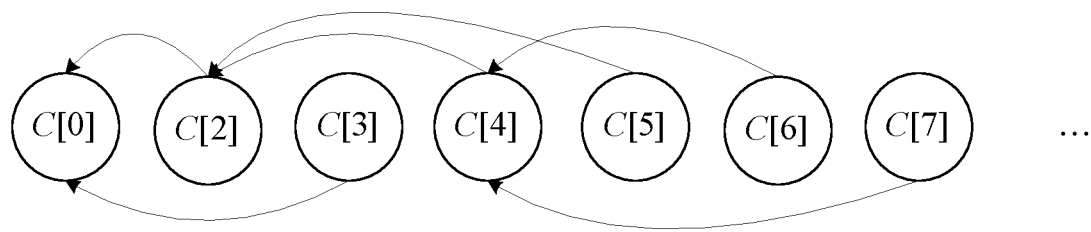
FIG. 7 is a schematic diagram of a linked list according to another embodiment of the present application.

Specifically, for any k, if pred[k]≠j, (C[j], pred[j]) is deleted from the linked list. For example, as shown in FIG. 7, if no arrow points to C[3], (C[3], pred[3]) is deleted from the linked list.

In this way, C[k] in the linked list is changed into a one-way linked list after pruning. That is, after the pruning, for different values of k, values of pred[k] are unequal.

Optionally, in an embodiment, the linked list may further include a count field ref[k] used to represent a quantity of information fields that point to the information field C[k], where ref[k] is 0, 1, or 2, and k is a non-negative integer that is not equal to 1.

Specifically,
if pred[k+2]=k and pred[k+3]=k, ref[k]=2;
if pred[k+2]=k and pred[k+3]≠k, ref[k]=1;
if pred[k+2]≠k and pred[k+3]=k, ref[k]=1; and
if pred[k+2]≠k and pred[k+3]≠k, ref[k]=0.

Therefore, in a process of further pruning the linked list, if ref[j], C[j],pred[j],ref[j] may be deleted from the linked list and ref[pred[j]] is updated at the same time, that is, 1 is subtracted from ref[pred[j]].

For example, the linked list may be pruned by using the following code. The following code is: PRUNE(C[•], pred[•]).

```
1: i←k−4;
2: while i>0 and ref[i]=0 do
3:   i'←pred[i];
4:   delete C[i], pred[i], ref[i];
5:   ref[i']←ref[i']−1;
6:   i←i';
7: end while
```

As shown in FIG. 7, neither C[5] nor C[6] points to C[3], that is, ref[3]=0. In this case, C[3],pred[3],ref[3] are deleted from the linked list. Because C[3] points to C[0], 1 is subtracted from ref[0] while C[3], pred[3], ref[3] are deleted.

In this way, in the pruned linked list, each value of ref[k] is equal to 1.

Specifically, the obtaining the target piecewise linear function according to the pruned linked list may include: using a generation line segment corresponding to C[k] in the pruned linked list as the multiple linear functions, and forming the target piecewise linear function by using the multiple linear functions.

The pruned linked list is referred to as a one-way linked list. Then, a generation line segment corresponding to each value of C[k] in the one-way linked list may be determined, and all of the generation line segments are combined to form the target piecewise linear function, where each generation line segment corresponds to one linear function.

The generation line segment corresponding to each value of C[k] in the one-way linked list may be determined by using the following code: EARLY-OUTPUT(C[•], pred[•]).

```
1: head←the first entry in C[•];
2: next←the second entry in C[•];
3: while ref[head]=1 and ref[next]=1 do
4:   if next <k−3 then
5:     output the corresponding piece of C[head];
6:     discard C[head];
```

7: head←next;
8: next←the next entry after C[next];
9: end if
10: end while

That is, the multiple linear functions may be determined by correspondingly extending a line segment represented by C[k] in the pruned linked list.

Further, in 104, a reference data point may be output. It may be understood that the reference data point includes a point of continuity and a point of discontinuity of the target piecewise linear function.

It may be understood that the reference data point in 104 includes only a point of continuity and a point of discontinuity of the target piecewise linear function. Specifically, the point of continuity is an inflection point of the target piecewise linear function, as shown in FIG. 1(*a*); the point of discontinuity is a discontinuous point of the target piecewise linear function, as shown in FIG. 1(*b*).

That is, there are multiple reference data points in 104, which may be understood as a set of reference data points. A reference data point in the set of reference data points may be an inflection point of the target piecewise linear function, and another reference data point in the set of reference data points may be a point of discontinuity of the target piecewise linear function.

Specifically, the target piecewise linear function includes multiple linear functions. A value range of an independent variable of each linear function of the multiple linear functions is a closed interval of time.

Specifically, the multiple linear functions include a first linear function and a second linear function that are adjacent to each other, where the "adjacent" indicates that an intersection set of a value range of an independent variable of the first linear function and a value range of an independent variable of the second linear function is not null, and the intersection set is a collection time parameter;

when a value of the independent variable is the collection time parameter, a function value of the first linear function is a first function value;

when a value of the independent variable is the collection time parameter, a function value of the second linear function is a second function value;

when the first function value is equal to the second function value, the reference data point includes the collection time parameter and the first function value; and when the first function value is not equal to the second function value, the reference data point includes the collection time parameter, the first function value, and the second function value.

Moreover, it may be understood that if an intersection set of a value range of an independent variable of a third linear function and a value range of an independent variable of a fourth linear function is null, it indicates that the third linear function is not adjacent to the fourth linear function.

That is, one reference data point may include two or three parameters. Specifically, if the reference data point is a point of continuity, two parameters are included; if the reference data point is a point of discontinuity, three parameters are included.

When a reference data point is a point of continuity, the reference data point includes two parameters, which are a collection time parameter and a first function value parameter, respectively. When a reference data point is a point of discontinuity, the reference data point includes three parameters, which are a collection time parameter, a first function value parameter, and a second function value parameter, respectively.

It is assumed that in C[k] in the pruned one-way linked list, C[i] and C[j] are adjacent to each other, that is, pred[j]=i.

A generation line segment corresponding to C[i] is marked as a first linear function, and has two end points $(t_1, y_1)$ and $(t_2, y_2)$, where $t_1 < t_2$. That is, a value range of an independent variable of the first linear function is a closed interval $[t_1, t_2]$.

A generation line segment corresponding to C[j] is marked as a second linear function, and has two end points $(t_3, y_3)$ and $(t_4, y_4)$, where $t_3 < t_4$. That is, a value range of an independent variable of the second linear function is a closed interval $[t_3, t_4]$.

Moreover, $t_2 = t_3$ is satisfied. That is, an intersection set of the value range of the independent variable of the first linear function and the value range of the independent variable of the second linear function is not null.

If $y_2 \neq y_3$, there is a discontinuity between the first linear function and the second linear function, the reference data point is a point of discontinuity, and $(t_2, y_2, y_3)$, which includes three parameters, is output. If $y_2 = y_3$, the first linear function is contiguous to the second linear function, the reference data point is a point of continuity, and $(t_3, y_3)$, which includes two parameters, is output.

Alternatively, if j=i+3, the reference data point is a point of discontinuity, and $(t_2, y_2, y_3)$ is output; if j=i+2, the reference data point is a point of continuity, and $(t_3, y_3)$ is output.

$t_2$, $t_3$ are collection time parameters, and $y_2$, $y_3$ are function values.

In this way, in this embodiment of the present application, in a process of collecting or storing flow data, a linked list is created, and the linked list can be further pruned to determine a target piecewise linear function, so as to perform piecewise linear approximation on the flow data. Moreover, the target piecewise linear function has a minimum quantity of parameters, and an obtained corresponding reference data point has a low requirement on storage space.

It may be understood that, in this embodiment of the present application, after a data point $p_t$ is acquired online, the method shown in FIG. 5 may be executing the following UPDATE(p) code:

1: for each vr ∈lvr do
2: if vr is open then
3: vr.update($p_t$);
4: end if
5: end for
6: while vr(nw(C[k−3])), vr(C[k−2]) are both closed do
7: if cw(nw(C[k−3]))≥cw(C[k−2]) then
8: C[k]←cw (nw(C[k−3])), pred[k]←k−3, ref[k−3]←ref[k−3]+1;
9: else
10: C[k]←cw (C[k−2]), pred[k]←k−2, ref[k−2]←ref[k−2]+1;
11: end if
12: discard vr(nw(C[k−3])), vr(C[k−2]) from lvr;
13: create vr(C[k]), vr(nw(C[k])) and insert them to lvr;
14: k←k+1.
15: PRUNE(C[•], pred[•]);
16: end while
17: EARLY-OUTPUT(C[•], pred[•]);

vr represents a visible region, lvr is a predefined visible region queue, and $$lvr = vr\{nw(C[k-3]), C[k-2], nw(C[k-2]), C[k-1], nw(C[k-1])\}$$

In this embodiment of the present application, flow data may be acquired online, and the method show in FIG. 5 may be executed simultaneously when a data point is acquired. Moreover, the determined reference data point may be output in advance or stored in advance. Specifically, in an execution process, all linked lists corresponding to values less than k–4 may be output, and a new linked list head is determined after outputting. In this way, time complexity of the method is O(1). That is, an amortized time overhead needed in the method of the present application is a constant.

Optionally, in an output process or a storing process, a Boolean array (Boolean array) may be used to store a type of a reference data point. For example, 0 is used to represent a point of continuity, and 1 is used to represent a point of discontinuity.

For example, the reference data point may be stored by using a list. For example, the first column of the list is 0 or 1 for representing a type of the reference data point, the second column of the list is a collection time parameter, the third column of the list is a corresponding function value parameter (a point of continuity), or the third column and the fourth column of the list are corresponding function value parameters (a point of discontinuity).

Optionally, in an output process or a storing process, a reference data point may be first converted into a one-dimensional data string and then stored.

Optionally, in an embodiment, a minus sign may be added in front of the collection time parameter of the point of discontinuity, for example, $(t_1, y_1, -t_2, y_2, y_2', \ldots )$. In this way, in subsequent reading of the data string, it may be determined according to a plus sign or a minus sign of the collection time parameter whether to read two parameters or three parameters as one reference data point. For example, when $-t_2$ is read, it is determined that the point is a point of discontinuity, and three numerals $-t_2, y_2, y_2'$ are read as a point of discontinuity $(t_2, y_2, y_2')$.

Optionally, in another embodiment, two parameters of a point of continuity may be changed to three parameters, and the last two parameters are equal, for example, $(t_1, y_1, y_1, t_2, y_2, y_2', \ldots )$. In this way, in subsequent reading of the data string, three numerals are read as a group. If the last two numerals of the three numerals are equal, the reference data point is a point of continuity; if the last two numerals of the three numerals are not equal, the reference data point is a point of discontinuity.

In this embodiment of the present application, the reference data point may also be stored by using another method, which is not limited in the present application.

It may be understood that, in this embodiment of the present application, in the process of compressing the flow data, the output reference data point includes not only a point of continuity but also a point of discontinuity. That is, the piecewise linear approximation of the present application is a hybrid approximation method. In this way, a minimum quantity of parameters are needed, a high compression rate can be reached, and storage space for storing the flow data can be further reduced.

Figure 8:
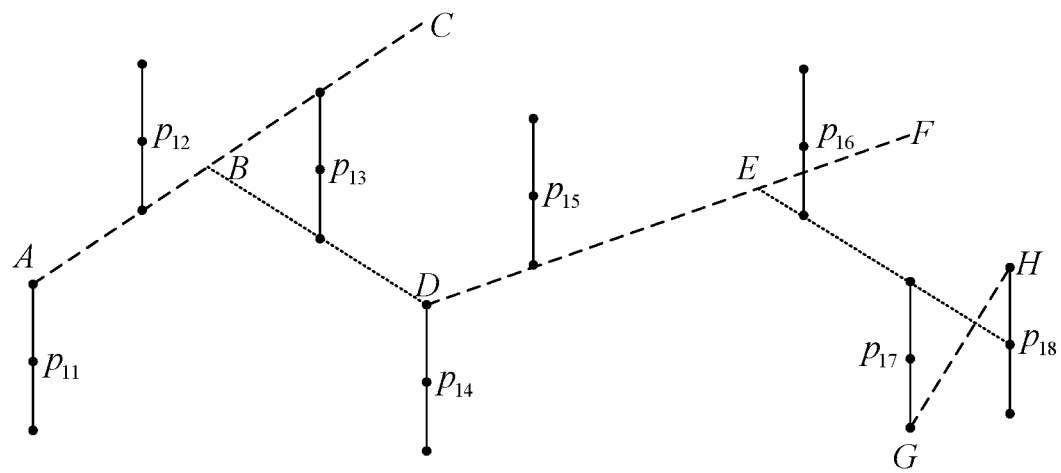
FIG. 8 is a schematic diagram of a piecewise linear function according to an embodiment of the present application.

For example, as shown in FIG. 8, for eight data points $p_{11}$ to $p_{18}$ among the data points in the flow data, if piecewise linear approximation is performed on each of the data points by using a point of continuity, an obtained piecewise linear line segment is $ABDEp_{18}$ which includes three points of continuity: B, D, and E, that is, six parameters are needed;

if piecewise linear approximation is performed on each of the data points by using a point of discontinuity, piecewise linear line segments are AC, DF and GH which include two points of discontinuity: C-D and F-G, that is, six parameters are needed;

if hybrid piecewise linear approximation of the present application is performed, piecewise linear line segments are AC and $DEp_{18}$, which include a point of continuity E and a point of discontinuity C-D, that is, five parameters are needed.

It can be seen that in hybrid piecewise linear approximation, flow data can be compressed by using a minimum quantity of parameters. Actually, the hybrid piecewise linear approximation is optimal piecewise linear approximation.

Specifically, compared with the pure continuity-type piecewise linear approximation or the pure discontinuity-type piecewise linear approximation, the hybrid piecewise linear approximation provided in this embodiment of the present application has a higher compression rate. For example, a quantity can be reduced by 15% after compression.

Figure 9:
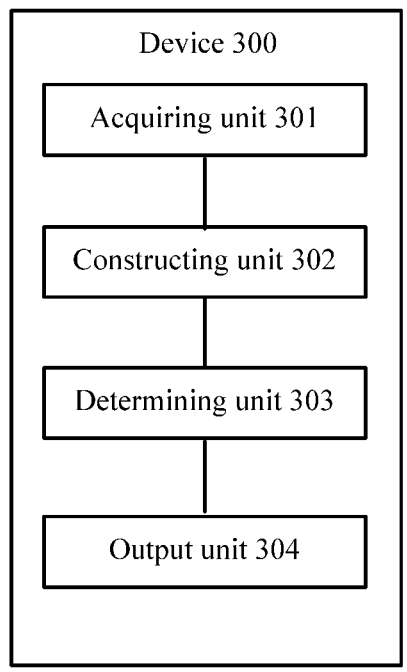
FIG. 9 is a block diagram of a device for compressing flow data according to an embodiment of the present application.

FIG. 9 is a block diagram of a device for compressing flow data according to an embodiment of the present application. A device 300 shown in FIG. 9 includes an acquiring unit 301, a constructing unit 302, a selecting unit 303, a determining unit 303, and an output unit 304.

The acquiring unit 301 is configured to acquire flow data and acquire a predefined maximum error, where the flow data includes multiple data points, and each data point of the multiple data points includes collection time of each data point and a data value collected at the collection time.

The constructing unit 302 is configured to construct multiple line segments according to the multiple data points and the maximum error that are acquired by the acquiring unit 301, where the multiple line segments do not intersect with each other; each line segment of the multiple line segments represents a function with time as an independent variable; and when a value of the independent variable is the collection time, an absolute value of a difference between a function value of the function and the data value collected at the collection time is less than or equal to the maximum error.

The determining unit 303 is configured to determine a target piecewise linear function according to the multiple line segments constructed by the constructing unit 302, where the target piecewise linear function includes multiple linear functions, and an intersection set of value ranges of independent variables of every two linear functions among the multiple linear functions includes a maximum of one value.

The output unit 304 is configured to output a reference data point according to the target piecewise linear function determined by the determining unit 303, where the reference data point is used to represent compressed flow data, and the reference data point includes a point of continuity and a point of discontinuity of the target piecewise linear function.

In this way, in this embodiment of the present application, multiple line segments are constructed according to multiple data points and a maximum error, a target piecewise linear function is further determined according to the multiple line segments, and a point of continuity and a point of discontinuity of the target piecewise linear function are used to represent compressed flow data. The device of this embodiment of the present application can ensure that the target piecewise linear function has a minimum quantity of parameters, which therefore has the lowest requirement on storage space.

Optionally, in an embodiment, the constructing unit 302 is specifically configured to:

create an extended polygon according to the multiple data points and the maximum error, where the extended polygon is used to represent a region in which the multiple line segments are located; and calculate a linked list based on the extended polygon, where the linked list includes an information field C[k] and a pointer field pred[k], the information field C[k] is used to represent the multiple line segments, and the pointer field pred[k] is used to indicate that the information field C[k] points to an information field C[pred[k]], where k is a non-negative integer that is not equal to 1, and C[k] corresponding to each value of k is used to represent one line segment of the multiple line segments.

Optionally, in another embodiment, C[k] may be obtained by using the following expression:

$$C[k] = \begin{cases} cw(w_0), & \text{condition 1} \\ cw(nw(C[k-3])), & \text{condition 2} \\ cw(C[k-2]), & \text{others} \end{cases}$$

where
condition 1 is: k=0;
condition 2 is: k=3 or k≥5 and cw(C[k−2]) is located on the left side of cw(nw(C[k−3]));
for k=0, pred[0] is null; and
for k≠0, if C[k]=cw(nw(C[k−3])), pred[k]=k−3;
if C[k]=cw (C[k−2]) pred[k]=k−2; where
$w_0$ is an initial window, cw(□) represents a closing window, and nw(□) represents a next window.

Optionally, in another embodiment, the determining unit 303 is specifically configured to determine the target piecewise linear function according to a direction relation between the multiple line segments.

Optionally, in another embodiment, the determining unit 303 is specifically configured to:
prune the linked list, so that for different values of k, values of pred[k] are unequal; and
determine the target piecewise linear function according to the pruned linked list.

Optionally, in another embodiment, the linked list further includes a count field ref[k] used to represent a quantity of information fields that point to the information field C[k];
if pred[k+2]=k and pred[k+3]=k, ref[k]=2;
if pred[k+2]=k and pred[k+3]≠k, ref[k]=1;
if pred[k+2]≠k and pred[k+3]=k, ref[k]=1; and
if pred[k+2]≠k and pred[k+3]≠k, ref[k]=0.

Optionally, in another embodiment, the determining unit 303 is specifically configured to: delete C[j], pred[j], ref[j] that correspond to ref[j]=0 from the linked list and update ref[pred[j]].

Optionally, in another embodiment, the determining unit 303 is specifically configured to: use a generation line segment corresponding to C[k] in the pruned linked list as the multiple linear functions, and form the target piecewise linear function by using the multiple linear functions.

Optionally, in another embodiment, the multiple linear functions include a first linear function and a second linear function that are adjacent to each other, where the "adjacent" indicates that an intersection set of a value range of an independent variable of the first linear function and a value range of an independent variable of the second linear function is not null, and the intersection set is a collection time parameter; when a value of the independent variable is the collection time parameter, a function value of the first linear function is a first function value;

when a value of the independent variable is the collection time parameter, a function value of the second linear function is a second function value;
when the first function value is equal to the second function value, the reference data point includes the collection time parameter and the first function value; and
when the first function value is not equal to the second function value, the reference data point includes the collection time parameter, the first function value, and the second function value.

Optionally, the device 300 shown in FIG. 9 is a data collection device for flow data.

The device 300 shown in FIG. 9 is capable of implementing the method for compressing flow data illustrated in the foregoing embodiment, which is not described herein again to avoid repetition.

Figure 10:
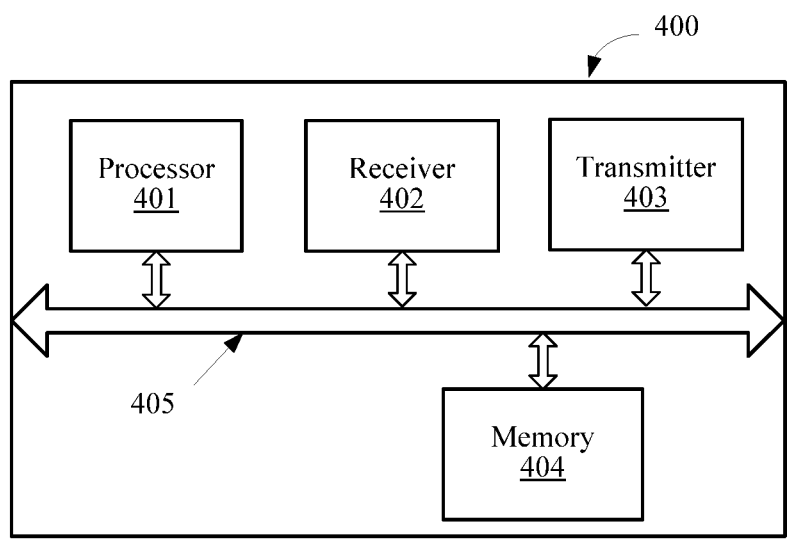
FIG. 10 is a block diagram of a device for compressing flow data according to another embodiment of the present application.

FIG. 10 is a block diagram of a device for compressing flow data according to another embodiment of the present application. A device 400 shown in FIG. 10 includes a processor 401, a receiver 402, a transmitter 403, and a memory 404.

The receiver 402 is configured to acquire flow data and acquire a predefined maximum error, where the flow data includes multiple data points, and each data point of the multiple data points includes collection time of each data point and a data value collected at the collection time.

The processor 401 is configured to construct multiple line segments according to the multiple data points and the maximum error that are acquired by the receiver 402, where the multiple line segments do not intersect with each other; each line segment of the multiple line segments represents a function with time as an independent variable; and when a value of the independent variable is the collection time, an absolute value of a difference between a function value of the function and the data value is less than or equal to the maximum error; and is further configured to determine a target piecewise linear function according to the multiple line segments, where the target piecewise linear function includes multiple linear functions, and an intersection set of value ranges of independent variables of every two linear functions among the multiple linear functions includes a maximum of one value.

The transmitter 403 is configured to output a reference data point according to the target piecewise linear function determined by the processor 401, where the reference data point is used to represent compressed flow data, and the reference data point includes a point of continuity and a point of discontinuity of the target piecewise linear function.

In this way, in this embodiment of the present application, multiple line segments are constructed according to multiple data points and a maximum error, a target piecewise linear function is further determined according to the multiple line segments, and a point of continuity and a point of discontinuity of the target piecewise linear function are used to represent compressed flow data. The method of this embodiment of the present application can ensure that the target piecewise linear function has a minimum quantity of parameters, which therefore has the lowest requirement on storage space.

Components in the device 400 are coupled by using a bus system 405. The bus system 405 further includes a power supply bus, a control bus, and a status signal bus in addition to a data bus. However, for clear description, all buses are marked as the bus system 405 in FIG. 10.

The method disclosed in the embodiment of the present application may be applied in the processor 401 or may be implemented by the processor 401. The processor 401 may be an integrated circuit chip having a signal processing capability. In implementation, each step of the foregoing method may be implemented by an integrated logic circuit of hardware or an instruction in a software form in the processor 401. The processor 401 may be a general purpose processor, a digital signal processor (Digital Signal Processor, DSP), an application specific integrated circuit (Application Specific Integrated Circuit, ASIC), a field programmable gate array (Field Programmable Gate Array, FPGA) or another programmable logical device, a discrete gate or transistor logic device, or a discrete hardware component, and may implement or execute the methods, steps, and logic block diagrams disclosed in the embodiments of the present application. The general purpose processor may be a microprocessor or the processor may be any conventional processor. The steps of the method disclosed with reference to the embodiments of the present application may be directly performed by a hardware decoding processor, or may be performed by a combination of hardware and software modules in the hardware decoding processor. The software module may be located in a mature storage medium in the art such as a random access memory, a flash memory, a read-only memory, a programmable read-only memory or an electrically erasable programmable read-only memory, and a register. The storage medium is located in the memory 404. The processor 401 reads information from the memory 404 and implements the steps of the foregoing method in combination with hardware.

It may be understood that the memory 404 in the embodiments of the present application may be a volatile memory or a nonvolatile memory, or may include a volatile memory and a nonvolatile memory. The nonvolatile memory may be a read-only memory (Read-Only Memory, ROM), a programmable read-only memory (Programmable ROM, PROM), an erasable programmable read-only memory (Erasable PROM, EPROM), an electrically erasable programmable read-only memory (Electrically EPROM, EEPROM), or a flash memory. The volatile memory may be a random access memory (Random Access Memory, RAM), used as an external cache. Through exemplary but not limitative description, many forms of RAMs may be used, for example, a static random access memory (Static RAM, SRAM), a dynamic random access memory (Dynamic RAM, DRAM), a synchronous dynamic random access memory (Synchronous DRAM, SDRAM), a double data rate synchronous dynamic random access memory (Double Data Rate SDRAM, DDR SDRAM), an enhanced synchronous dynamic random access memory (Enhanced SDRAM, ESDRAM), a synchronous link dynamic random access memory (Synchlink DRAM, SLDRAM), and a direct rambus random access memory (Direct Rambus RAM, DR RAM). The memory 404 in the system and the method described in this specification is intended to include, but is not limited to, these memories and any other suitable type of memory.

It may be understood that the embodiments described in this specification may be implemented by hardware, software, firmware, middleware, microcode or a combination of the above. For hardware implementation, a processing unit may be implemented in one or more application specific integrated circuits (Application Specific Integrated Circuits, ASIC), a digital signal processor (Digital Signal Processing, DSP), a digital signal processing device (DSP Device, DSPD), a programmable logic device (Programmable Logic Device, PLD), a field-programmable gate array (Field-Programmable Gate Array, FPGA), a general purpose processor, a controller, a micro-controller, a microprocessor, and other electronic units configured to execute the functions described in this application, or a combination of the above.

When the embodiments are implemented in software, firmware, middleware, microcode, program code, or a code segment, they may be stored in a machine-readable medium of, for example, a storage component. The code segment may represent a process, a function, a subprogram, a program, a routine, a subroutine, a module, a software group, a class, or any combination of instructions, data structures or program statements. The code segment may be coupled to another code segment or hardware circuit by transmitting and/or receiving information, data, an independent variable, a parameter, or memory content. The information, the independent variable, the parameter, the data, and the like may be delivered, forwarded, or sent in any suitable manner such as memory sharing, message delivering, token delivering, and network transmission.

For software implementation, the technology described in this specification may be implemented by using modules for executing the functions (for example, a process or a function) described in this specification. Software code may be stored in a memory unit and executed by a processor. The memory unit may be implemented inside a processor or outside a processor, and in the latter case, the memory unit may be coupled to the processor in a communication manner through various means known in the art.

In this way, in this embodiment of the present application, multiple line segment groups are determined through piecewise linear approximation, and after a target line segment group is selected from the multiple line segment groups, a target piecewise linear function is generated according to the target line segment group, and a point of continuity and a point of discontinuity of the piecewise linear function are used to represent compressed flow data. The method of this embodiment of the present application can ensure that the target piecewise linear function has a minimum quantity of parameters, which therefore has the lowest requirement on storage space.

Optionally, in an embodiment, the processor 401 is specifically configured to:

create an extended polygon according to the multiple data points and the maximum error, where the extended polygon is used to represent a region in which the multiple line segments are located; and calculate a linked list based on the extended polygon, where the linked list includes an information field C[k] and a pointer field pred[k], the information field C[k] is used to represent the multiple line segments, and the pointer field pred[k] is used to indicate that the information field C[k] points to an information field C[pred[k]], where k is a non-negative integer that is not equal to 1, and C[k] corresponding to each value of k is used to represent one line segment of the multiple line segments.

Optionally, in another embodiment, C[k] may be obtained by using the following expression:

$$C[k] = \begin{cases} cw(w_0), & \text{condition 1} \\ cw(nw(C[k-3])), & \text{condition 2} \\ cw(C[k-2]), & \text{others} \end{cases}$$

where
condition 1 is: k=0;
condition 2 is: k=3 or k≥5 and cw(C[k−2]) is located on the left side of cw(nw(C[k−3]));
for k=0, pred[0] is null; and
for k≠0, if C[k]=cw(nw(C[k−3])), pred[k]=k−3;
if C[k]=cw(C[k−2]), pred[k]=k−2; where
$w_0$ is an initial window, cw(□) represents a closing window, and nw(□) represents a next window.

Optionally, in another embodiment, the processor 401 is specifically configured to: determine the target piecewise linear function according to a direction relation between the multiple line segments.

Optionally, in another embodiment, the processor 401 is specifically configured to:
prune the linked list, so that for different values of k, values of pred[k] are unequal; and
determine the target piecewise linear function according to the pruned linked list.

Optionally, in another embodiment, the linked list further includes a count field ref[k] used to represent a quantity of information fields that point to the information field C[k];
if pred[k+2]=k and pred[k+3]=k, ref[k]=2;
if pred[k+2]=k and pred[k+3]≠k, ref[k]=1;
if pred[k+2]≠k and pred[k+3]=k, ref[k]=1; and
if pred[k+2]≠k and pred[k+3]≠k, ref[k]=0.

Optionally, in another embodiment, the processor 401 is specifically configured to: delete C[j],pred[j],ref[j] that correspond to ref[j]=0 from the linked list and update ref[pred[j]].

Optionally, in another embodiment, the processor 401 is specifically configured to: use a generation line segment corresponding to C[k] in the pruned linked list as the multiple linear functions, and form the target piecewise linear function by using the multiple linear functions.

Optionally, in another embodiment, the multiple linear functions include a first linear function and a second linear function that are adjacent to each other, where the "adjacent" indicates that an intersection set of a value range of an independent variable of the first linear function and a value range of an independent variable of the second linear function is not null, and the intersection set is a collection time parameter;
when a value of the independent variable is the collection time parameter, a function value of the first linear function is a first function value;
when a value of the independent variable is the collection time parameter, a function value of the second linear function is a second function value;
when the first function value is equal to the second function value, the reference data point includes the collection time parameter and the first function value; and
when the first function value is not equal to the second function value, the reference data point includes the collection time parameter, the first function value, and the second function value.

Optionally, the device 400 shown in FIG. 10 is a data collection device for flow data.

The device 400 shown in FIG. 10 is capable of implementing the method for compressing flow data illustrated in the foregoing embodiment, which is not described herein again to avoid repetition.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present application.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present application essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of the present application. The foregoing storage medium includes: any medium that can store program code, such as a USB flash drive, a removable hard disk, a ROM, a RAM, a magnetic disk, or an optical disc.

The foregoing descriptions are merely specific implementation manners of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be subject to the protection scope of the claims.

What is claimed is:

1. A method for compressing flow data, comprising:
acquiring flow data, wherein the flow data comprises multiple data points, and each data point of the multiple data points comprises collection time of each data point and a data value collected at the collection time;

acquiring a maximum error that is predefined;

constructing multiple line segments according to the multiple data points and the maximum error, wherein the multiple line segments do not intersect with each other, each line segment of the multiple line segments represents a function with time as an independent variable, and when a value of the independent variable is the collection time, an absolute value of a difference between a function value of the function and the data value collected at the collection time is less than or equal to the maximum error;

obtaining a target piecewise linear function according to the multiple line segments, wherein the target piecewise linear function comprises multiple linear functions, and an intersection set of value ranges of independent variables of every two linear functions among the multiple linear functions comprises a maximum of one value; and outputting a reference data point according to the target piecewise linear function, wherein the reference data point is used to represent compressed flow data, and the reference data point comprises a point of continuity and a point of discontinuity of the target piecewise linear function.

2. The method according to claim 1, wherein the constructing the multiple line segments according to the multiple data points and the maximum error comprises:

creating an extended polygon according to the multiple data points and the maximum error, wherein the extended polygon is used to represent a region in which the multiple line segments are located; and calculating a linked list based on the extended polygon, wherein the linked list comprises an information field $C[k]$ and a pointer field $pred[k]$, the information field $C[k]$ is used to represent the multiple line segments, and the pointer field $pred[k]$ is used to indicate that the information field $C[k]$ points to an information field $C[pred[k]]$, and wherein k is a non-negative integer that is not equal to 1, and $C[k]$ corresponding to each value of k is used to represent one line segment of the multiple line segments.

3. The method according to claim 2, wherein the information field $C[k]$, is obtained by using the following expression:

$$C[k] = \begin{cases} cw(w_0), & \text{condition 1} \\ cw(nw(C[k-3])), & \text{condition 2} \\ cw(C[k-2]), & \text{others} \end{cases}$$

wherein
wherein the condition 1 is: k=0,
the condition 2 is: k=3 or k≥5, and the $cw(C[k-2])$ is located on the left side of the $cw(nw(C[k-3]))$,
wherein for k=0, pred[0] is null,
wherein for k≠0, if $C[k]=cw(nw(C[k-3]))$, $pred[k]=k-3$, if $C[k]=cw(C[k-2])$, $pred[k]=k-2$, and
wherein the $w_0$ is an initial window, $cw(\square)$ represents a closing window, and $nw(\square)$ represents a next window.

4. The method according to claim 2, wherein the obtaining the target piecewise linear function according to the multiple line segments comprises:

obtaining the target piecewise linear function according to a direction relation between the multiple line segments.

5. The method according to any claim 2, wherein the obtaining the target piecewise linear function according to the multiple line segments comprises:

pruning the linked list, so that for different values of k, values of $pred[k]$ are unequal; and obtaining the target piecewise linear function according to the pruned linked list.

6. The method according to claim 5, wherein the linked list further comprises a count field $ref[k]$, used to represent a quantity of information fields that point to the information field $C[k]$, wherein if $pred[k+2]=k$ and $pred[k+3]=k$, $ref[k]=2$,
if $pred[k+2]=k$ and $pred[k+3]\neq k$, $ref[k]=1$,
if $pred[k+2]\neq k$ and $pred[k+3]=k$, $ref[k]=1$, and
if $pred[k+2]\neq k$ and $pred[k+3]\neq k$, $ref[k]=0$.

7. The method according to claim 6, wherein the pruning the linked list comprises:

deleting $C[j]$, $pred[j]$, $ref[j]$ that correspond to $ref[j]=0$ from the linked list; and updating $ref[pred[j]]$.

8. The method according to claim 5, wherein the obtaining the target piecewise linear function according to the pruned linked list comprises:

using a generation line segment corresponding to $C[k]$ in the pruned linked list as the multiple linear functions; and forming the target piecewise linear function by using the multiple linear functions.

9. The method according to claim 1, wherein the multiple linear functions comprise a first linear function and a second linear function that are adjacent to each other, wherein the "adjacent" indicates that an intersection set of a value range of an independent variable of the first linear function and a value range of an independent variable of the second linear function is not null, and the intersection set is a collection time parameter, when a value of the independent variable is the collection time parameter, a function value of the first linear function is a first function value, when a value of the independent variable is the collection time parameter, a function value of the second linear function is a second function value, when the first function value is equal to the second function value, the reference data point comprises the collection time parameter and the first function value, and when the first function value is not equal to the second function value, the reference data point comprises the collection time parameter, the first function value, and the second function value.

10. A device for compressing flow data, comprising:

a receiver, configured to acquire flow data and acquire a maximum error that is predefined, wherein the flow data comprises multiple data points, and each data point of the multiple data points comprises collection time of each data point and a data value collected at the collection time;

a processor, configured to construct multiple line segments according to the multiple data points and the maximum error that are acquired by the receiver and determine a target piecewise linear function according to the multiple line segments, wherein the multiple line segments do not intersect with each other, each line segment of the multiple line segments represents a function with time as an independent variable, and when a value of the independent variable is the collection time, an absolute value of a difference between a function value of the function and the data value collected at the collection time is less than or equal to the maximum error, wherein the target piecewise linear function comprises multiple linear functions, and an intersection set of value ranges of independent variables of every two linear functions among the multiple linear functions comprises a maximum of one value; and a transmitter, configured to output a reference data point according to the target piecewise linear function determined by the obtaining unit, wherein the reference data point is used to represent compressed flow data, and the reference data point comprises a point of continuity and a point of discontinuity of the target piecewise linear function.

11. The device according to claim 10, wherein the processor is configured to:

create an extended polygon according to the multiple data points and the maximum error, wherein the extended polygon is used to represent a region in which the multiple line segments are located; and calculate a linked list based on the extended polygon, wherein the linked list comprises an information field C[k] and a pointer field pred[k], the information field C[k] is used to represent the multiple line segments, and the pointer field pred[k] is used to indicate that the information field C[k] points to an information field C[pred[k]] wherein k is a non-negative integer that is not equal to 1, and C[k] corresponding to each value of k is used to represent one line segment of the multiple line segments.

12. The device according to claim 11, wherein C[k] is obtained by using the following expression:

$$C[k] = \begin{cases} cw(w_0), & \text{condition 1} \\ cw(nw(C[k-3])), & \text{condition 2} \\ cw(C[k-2]), & \text{others} \end{cases}$$

wherein condition 1 is: k=0;
condition 2 is: k=3 or k≥5 and cw (C[k−2]) is located on the left side of cw(nw(C[k−3]));
for k=0; pred[0] is null; and
for k≠0, if C[k]=cw(nw(C[k−3])), pred[k]=k−3;
if C[k]=cw (C[k−2]), pred[k]=k−2; wherein
$w_0$ is an initial window, cw(□) represents a closing window, and nw(□) represents a next window.

13. The device according to claim 11, wherein the processor is configured to:

determine the target piecewise linear function according to a direction relation between the multiple line segments.

14. The device according to claim 11, wherein the processor is configured to:

prune the linked list, so that for different values of k, values of pred[k] are unequal; and determine the target piecewise linear function according to the pruned linked list.

15. The device according to claim 14, wherein the linked list further comprises a count field ref[k], used to represent a quantity of information fields that point to the information field C[k];

if pred[k+2]=k and pred[k+3]=k, ref[k]=2;
if pred[k+2]=k and pred[k+3]≠k, ref[k]=1;
if pred[k+2]≠k and pred[k+3]=k, ref[k]=1; and
if pred[k+2]≠k and pred[k+3]≠k, ref[k]=0.

16. The device according to claim 15, wherein the obtaining unit is specifically configured to:

delete C[j],pred[j],ref[j] that correspond to ref[j]=0 from the linked list and update ref[pred[j]].

17. The device according to claim 14, wherein the processor is configured to:

use a generation line segment corresponding to C[k] in the pruned linked list as the multiple linear functions, and form the target piecewise linear function by using the multiple linear functions.

18. The device according to claim 11, wherein the multiple linear functions comprise a first linear function and a second linear function that are adjacent to each other, wherein the "adjacent" indicates that an intersection set of a value range of an independent variable of the first linear function and a value range of an independent variable of the second linear function is not null, and the intersection set is a collection time parameter;

when a value of the independent variable is the collection time parameter, a function value of the first linear function is a first function value;

when a value of the independent variable is the collection time parameter, a function value of the second linear function is a second function value;

when the first function value is equal to the second function value, the reference data point comprises the collection time parameter and the first function value; and when the first function value is not equal to the second function value, the reference data point comprises the collection time parameter, the first function value, and the second function value.

* * * * *